United States Patent [19]

Mahan et al.

[11] Patent Number: 5,776,819
[45] Date of Patent: Jul. 7, 1998

[54] DEPOSITION OF DEVICE QUALITY, LOW HYDROGEN CONTENT, AMORPHOUS SILICON FILMS BY HOT FILAMENT TECHNIQUE USING "SAFE" SILICON SOURCE GAS

[75] Inventors: Archie Harvin Mahan, Golden; Edith C. Molenbroek, Boulder; Brent P. Nelson, Golden, all of Colo.

[73] Assignee: Midwest Research Institute, Kansas City, Mo.

[21] Appl. No.: 222,720

[22] Filed: May 25, 1994

Related U.S. Application Data

[63] Continuation-in-part of Ser. No. 878,585, May 5, 1992, abandoned.

[51] Int. Cl.$^6$ ............................................. H01L 21/203
[52] U.S. Cl. ........................... 438/482; 438/485; 427/99; 148/DIG. 1
[58] Field of Search ..................... 437/101; 148/DIG. 1; 427/99; 438/485, 482

[56] References Cited

U.S. PATENT DOCUMENTS

| | | | |
|---|---|---|---|
| 3,014,791 | 12/1961 | Benzing et al. | 23/273 |
| 4,237,150 | 12/1980 | Wiesmann | 427/74 |
| 4,237,151 | 12/1980 | Strongin et al. | 427/74 |
| 4,459,163 | 7/1984 | Macdiarmid et al. | 148/174 |
| 4,485,128 | 11/1984 | Dalal et al. | 427/85 |
| 4,634,605 | 1/1987 | Wiesmann | 427/249 |
| 4,702,965 | 10/1987 | Fang | 428/457 |
| 4,749,588 | 6/1988 | Fukuda et al. | 427/39 |
| 4,810,526 | 3/1989 | Ito et al. | 427/50 |
| 4,839,701 | 6/1989 | Imagawa et al. | 357/2 |
| 5,017,308 | 5/1991 | Iijima et al. | 252/501.1 |
| 5,151,383 | 9/1992 | Meyerson et al. | 437/101 |
| 5,397,737 | 3/1995 | Mahan et al. | 437/101 |
| 5,527,629 | 6/1996 | Gastiger et al. | 428/688 |

FOREIGN PATENT DOCUMENTS 3-187215A  8/1991  Japan.

OTHER PUBLICATIONS

Mahan et al, "Deposition of Device Quality, Low H Content Amorphous Silicon", J. Appl. Phys. 69(9), 1 May 1991.

"Transition from Amorphous to Crystalline Silicon: Effect of Hydrogen on Film Growth," C.C. Tsai, et al., Material Research Society Symposium Proceedings, vol. 118, 1988.

"Microstructure of Plasma-Deposited a-Si:H Films", J.C. Knights and R.A. Lujan, Applied Physics Letters, vol. 35, No. 1, Aug. 1, 1979.

"Production of high-quality amorphous silicon films by evaporative silane surface decompositions," J. Doyle, R. Robertson, G.H. Lin, M.Z. He, and A. Gallagher, J. Appl. Phys. 64 (6) dated 15 Sep. 1988.

"Amorphous Semiconducting Silicon-Hydrogen Alloys," H. Fritzsche, C.C. Tsai, and P. Perans, Solid State Technology dated Jan. 1978.

"A Review of the Structure, Properties and Applications of Hydrogenated Amorphous Silicon," Z. Smith, 1983.

"The defect density in amorphous silicon," by M. Stutzmann, Philosophical Magazine B, 1989, vol. 60, No. 4, pp. 531-546.

"Deposition of a-Si:H by Homogeneous CVD," by B.A. Scott, R.M. Plecenik, and E.E. Simonyi, Journal de Physique, vol. C4, pp. 635-638.

*Primary Examiner*—Charles L. Bowers, Jr.
*Assistant Examiner*—Matthew Whipple
*Attorney, Agent, or Firm*—Edna M. O'Connor; Ken Richardson

[57] ABSTRACT

A method of producing hydrogenated amorphous silicon on a substrate by flowing a stream of safe (diluted to less than 1%) silane gas past a heated filament.

7 Claims, 7 Drawing Sheets

DEPOSITION OF DEVICE QUALITY, LOW HYDROGEN CONTENT, AMORPHOUS SILICON FILMS BY HOT FILAMENT TECHNIQUE USING "SAFE" SILICON SOURCE GAS

CROSS-REFERENCE TO RELATED PATENT APPLICATIONS

This patent application is a continuation-in-part of U.S. patent application Ser. No. 07/878,585, filed on May 5, 1992, abandoned

CONTRACTUAL ORIGIN OF THE INVENTION

The United States Government has rights in this invention under Contract No. DE-AC02-83CH10093 between the U.S. Department of Energy and the Solar Energy Research Institute, a Division of Midwest Research Institute.

BACKGROUND OF THE INVENTION

1. Field of the Invention

The present invention relates to the deposition of thin films of material on a substrate, and more specifically to the deposition of device quality hydrogenated amorphous silicon (a-Si:H) containing low hydrogen content for use as photovoltaic and other semiconducting devices.

2. Description of the Prior Art

In the manufacture and construction of microelectronic semiconductor devices and photovoltaic solar cells, amorphous silicon is often a feasible alternative to the use of silicon crystals for layers of a device, due to economics, flexibility in manufacture, and higher through-put. However, amorphous silicon tends to react chemically with its environment, causing it to become contaminated, and thereby deteriorating the chemical, electrical, and mechanical properties of the intrinsic or undoped silicon. This reactivity of the amorphous silicon can be passivated by the incorporation of hydrogen into the amorphous silicon layer, which is usually accomplished during the deposition process, and it considerably improves the electrical properties of the individual layers and the device.

Two measures of these electrical properties of hydrogenated amorphous silicon layers are the Urbach tail width and the density of midgap states, both of which should be minimized to achieve device quality semiconductor films. Although exact mechanisms are not known, there has appeared to be a relationship in glow discharge deposited films between the amount of hydrogen incorporated and both the Urbach tail width and density of midgap states. At hydrogen concentrations too low, the amorphous silicon film exhibits very poor electrical properties due to the high density of midgap states and is thus not suitable for use in practical devices. At hydrogen concentrations too high, these films show an increased density of microvoids and once again inferior electrical properties.

Incorporation of this hydrogen into the amorphous silicon film is not without its costs, however. Specifically, when this hydrogenated amorphous silicon is used in photovoltaic solar cells, these solar cells over time degrade electrically upon exposure to sunlight. This degradation, which is referred to as the Staebler-Wronksi effect, has been strongly linked to the concentration of hydrogen within the amorphous silicon film. The prevalent model for the Staebler-Wronksi effect suggests that the degradation is due to movement of hydrogen within the film.

In the last decade or so, since the development of the glow discharge (GD) technique as the standard means for producing device quality hydrogenated amorphous silicon films for solar cells and other applications, there has been considerable progress made in increasing the efficiencies of these solar cells. However, most of this progress has been in improved techniques in manufacturing and utilization of these solar cells, such as better uniformity of deposition, better light utilization, and better doping of layers. The U.S. Pat. No. 4,237,150, issued to H. Weismann, and the U.S. Pat. No. 4,237,151, issued to Strongin et al. illustrate attempts to improve amorphous silicon as a photovoltaic material by using silane as a silicon source gas in a hot wire deposition technique to eliminate impurities, non-uniformities, and clusters of silicon that they thought limited the utility of the material. J. Doyle et al. in their article, *Production of High Quality Amorphous Silicon Films by Evaporative Silane Surface Decomposition*, published in the Journal of Applied Physics, Vol. 64, p. 3215–3223, 1988, gave credit to H. Weismann and carried the improvements to better temperature and vacuum ranges, but they apparently were not able to control the degradation from the Staebler-Wronski effect. No improvements either in the material quality or in the Staebler-Wronski effect were achieved along with the other improvements that were reported in those publications. Also, silane gas is toxic and very explosive and flammable, so it is not considered to be a safe gas for use in even laboratory work without stringent safety controls, let alone industrial or commercial applications. Therefore, there is still room, in fact a need, for additional attention and improvement to this technology to increase efficiencies and usefulness, particularly for solar applications.

SUMMARY OF THE INVENTION

Accordingly, a general object of the present invention is to provide a hydrogenated amorphous silicon film which demonstrates state-of-the-art material quality of the intrinsic or undoped material.

Another general object of the present invention is to provide a viable, economical, and high through-put method of depositing hydrogenated amorphous silicon films for solar cells and other applications, which films demonstrate significantly improved electrical, chemical, and structural qualities.

It is also an object of this invention to provide a hot wire or other deposition process in which a safe silicon and hydrogen atom source gas can be used to produce device quality hydrogenated amorphous silicon film on a substrate.

Additional objects, advantages, and novel features of the invention shall be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purpose of the present invention, as embodied and broadly described herein, the method of this invention may comprise producing a thin film of hydrogenated amorphous silicon with a low hydrogen content by flowing a silicohydride gas past a filament which has been heated to a sufficient temperature to thermally decompose the silicohydride on the filament into mostly, atomic silicon and atomic hydrogen. The filament should be heated to at least 1500° C., but is preferably heated to about 2,000° C. This gaseous mixture of mostly atomic silicon and atomic hydrogen is then evaporated from the filament and is deposited onto a substrate heated to between 200° and 600° C., but which is preferably heated to about 400° C. (about 300° to 450° C. surface temperature) for concentrated silane, but preferably about 290° C. when safe or diluted silane is used as a source of silicon and hydrogen. Safe gas or diluted silane comprises less than one percent (1%) silane in ninety-nine percent (99%) inert gas. This procedure of thermally decomposing the silicohydride on the heated filament and then depositing the resultant gaseous mixture onto a heated substrate occurs within a deposition chamber maintained at an optimal pressure in the range of about 5–50 millitorr, preferably about 8 millitorr for concentrated silane, or about 50–500 millitorr, preferably about 80 millitorr, for safe or diluted silane.

The silicohydride gas may be silane, disilane, noble gases, or other gases or combinations of gases containing silicon and hydrogen. The heated filament is preferably made from tungsten, but can be made from other high temperature materials such as graphite or silicon carbide. When the silicohydride gas is decomposed at those temperature and pressure ranges described above, the hydrogen content of the film appears to be controlled by the temperature of the substrate, such that the higher the temperature the lower the hydrogen content. Despite hydrogen contents as low as one atomic percent hydrogen, the hydrogenated amorphous silicon films produced with concentrated silane in the process of this invention still exhibit photovoltaic device quality electrical, chemical, and mechanical properties which will not as readily degrade upon exposure to sunlight. These same results of better resistance to degradation in sunlight have not yet been achieved with the diluted silane in the process of this invention. However, the safe (diluted) silane gas used according to this invention has been used to produce results as good as those that were achievable prior to this invention only by using unsafe, concentrated silane gas, and even better results are believed to be achievable.

BRIEF DESCRIPTION OF THE DRAWINGS

The accompanying drawings, which are incorporated herein and form a part of the specification illustrate preferred embodiments of the present invention, and together with the description, serve to explain the principles of the invention.

In the drawings.

DETAILED DESCRIPTION OF THE PREFERRED EMBODIMENTS

A device quality low hydrogen content, hydrogenated amorphous silicon film is produced by the high temperature decomposition of a gas containing silicon and hydrogen, under a vacuum, by depositing the decomposed gas onto a heated substrate. Heretofore it has been believed that to achieve a device quality hydrogenated amorphous silicon film, as determined by measuring such parameters as Urbach Tail widths, Tauc's Bandgap, Photo-conductivity, and Dark Conductivity, that the film had to contain at least between 10 and 15 atomic percent (at. %) hydrogen. However, the low hydrogen content, hydrogenated amorphous silicon films produced with concentrated silane according to the principles of the present invention, at about 1 at. % hydrogen, exhibits superior device quality films despite their low hydrogen content.

An alternate embodiment of this invention also achieves device quality hydrogenated amorphous silicon, but with safer materials, including the use of highly diluted source gas comprising less than one percent (1%) silane or other silicohydride gas in helium or some other inert gas. This diluted gas mixture is sometimes referred to herein as helium-diluted safe gas or simply as safe silane or safe gas. At present, films produced with the helium-diluted safe silane gas according to this invention have not exhibited such superior results at low hydrogen content, but they are at least equal to state-of-the-art films with 10 at. % produced by other methods that require concentrated silane and that do not achieve even those results from diluted silane. Consequently, the process of this invention achieves better than state-of-the-art results for low (1 at. %) hydrogen content from concentrated silane. It also achieves at least state-of-the-art results for "standard" (10 at. %) hydrogen from very diluted silane, which has not been achieved prior to this invention.

Figure 1:
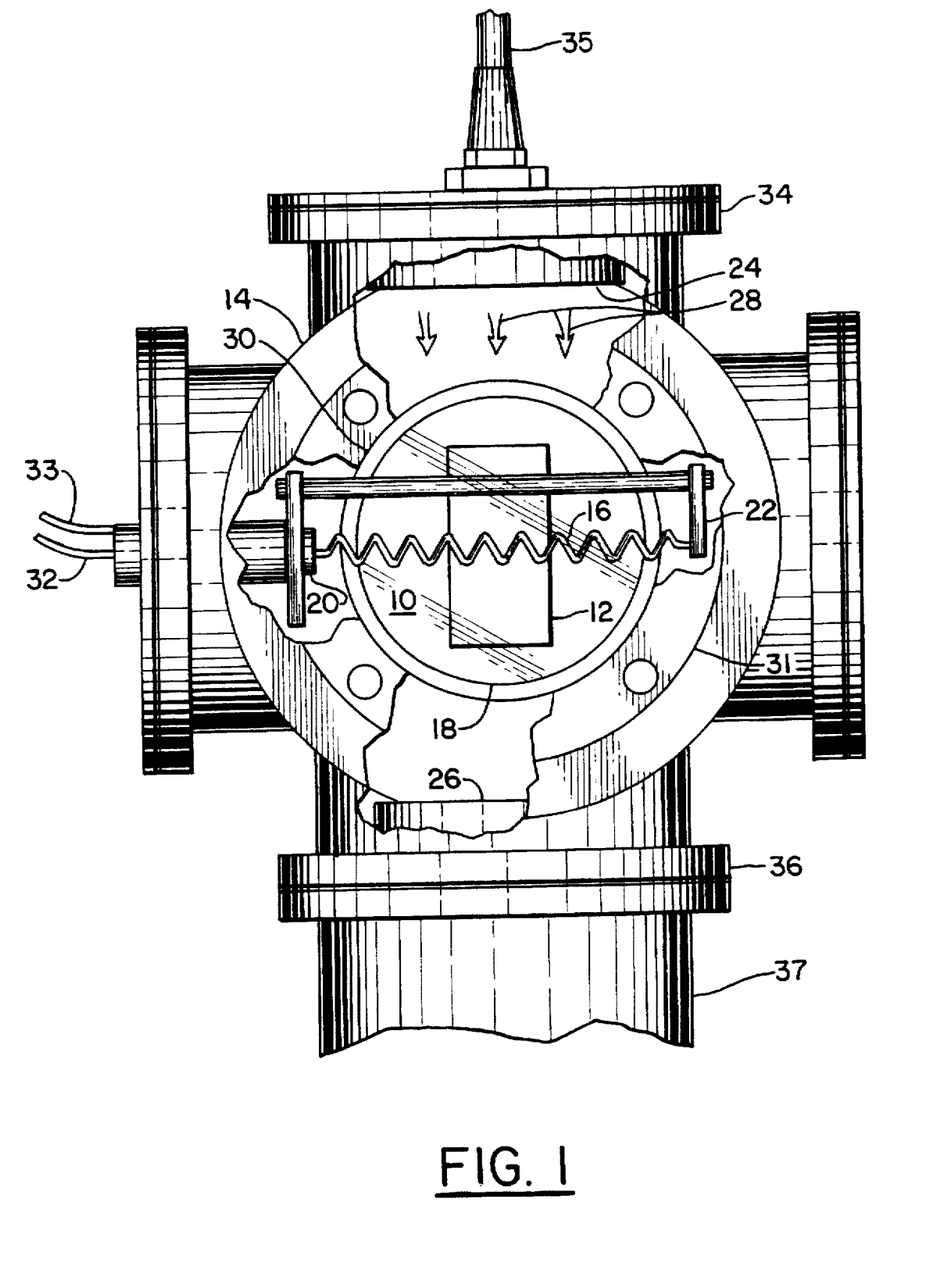
FIG. 1 is a top plan view of a hot filament chemical vapor deposition chamber suitable for producing the low hydrogen content, hydrogenated amorphous silicon film according to the principles of the present invention.

The low hydrogen content, hydrogenated amorphous silicon film may be produced according to this invention with any suitable apparatus as will be understood readily by persons skilled in the art upon gaining an understanding of the features of this invention. However, to facilitate the explanation of this invention, suitable apparatus is illustrated in FIG. 1. A typical deposition chamber 10 enclosed by a housing 14 is illustrated from a top plan view with a transparent window 30 mounted in the top flanged opening 31 and with portions of the housing 14 broken away to show the operative components in the chamber 10. A substrate table or holder 18 is positioned in the chamber 10 to support a substrate 12 on which the hydrogenated amorphous silicon film is to be deposited. A heating element (not shown) is provided under the substrate table 18, preferably outside the vacuum system, to heat the substrate 12 to the desired temperatures, which are described in more detail below. A wire filament 16, preferably tungsten, is supported between two electrodes 20, 22 a spaced distance over the substrate holder 18, and electric power is supplied to the electrodes 20, 22 by wire leads 32, 33. A gas inlet 24 mounted in flange 34 is connected by a conduit 35 to a feed gas source (not shown), and an outlet port 26 mounted in the diametrically opposite flange 36 is connected by a conduit 37 to a vacuum pump (not shown).

In operation, the substrate 12 is placed on support table 18, and the chamber 10 is sealed. The vacuum pump (not shown) is turned on, and the chamber 10 is evacuated. A silicohydride gas, as will be described in more detail below, is made to flow into the chamber 10 through tube 35 and inlet 24, as indicated by arrows 28. The silicohydride gas flows across chamber 10 preferably transverse to the filament 16. When electric power is applied to the filament 16, it gets very hot, and the silicohydride gas is absorbed onto the hot filament 16 similar to a catalytic converter, where it is decomposed and re-evaporated substantially in the form of its atomic species, silicon and hydrogen. The silicon and hydrogen are then coated onto the substrate, as will be described in more detail below.

There are four important identified deposition parameters that have to be optimized to produce good device quality films of hydrogenated amorphous silicon, according to this invention. These four parameters, all of which have to be coordinated and kept within the preferred ranges, include filament temperature, chamber pressure, distance between filament and substrate, and substrate temperature, as will be described in more detail below.

The filament temperature at which the decomposition of the silicohydride gas begins will vary somewhat, depending on the specific silicohydride gas used, such as, for example, silane, disilane, or other gases or combinations of gases containing silicon and hydrogen. The preferred gas is silane ($SiH_4$), and even more preferred safe (helium-diluted) silane or "safe gas", for which the filament 16 temperature should be at least 1,500° C. and preferably 2,000° C. That temperature provides the most efficient and effective decomposition of the silane gas to its constituent elements, silicon and hydrogen. The flow of silane, preferably at a rate of about 20 sccm can be regulated by a flow controller and is pumped through the chamber by means of a turbo-molecular pump. The temperatures at the ends of the filament 16 are usually not as high as in the center, and, where such end temperatures are less than 1,500° C., such as around 1,400° C., the silicon and possibly even the hydrogen, tend to alloy at those outer ends, which is an undesirable effect that should be kept to a minimum for the purposes of this invention.

As the decomposed silicon and hydrogen atomic species are evaporated off the hot filament 16 and migrate toward the substrate 12, some collisions occur among the silicon and hydrogen atoms and the undecomposed $SiH_4$ gas molecules due to normal Brownian movements. A few of these collisions seem to be desirable, even necessary, according to this invention, to produce a good, device quality, hydrogenated amorphous silicon film. However, too few collisions and too many collisions are deleterious to the quality of the film. The number of atomic collisions is a function of the pressure in chamber 10 and of the distance between the filament 16 and the substrate 12, so those parameters have to be controlled carefully. It has been found, according to this invention, that, when using concentrated silane, a pressure in the range of about 5 to 50 millitorr (preferably about 8 millitorr) and a distance between the filament 16 and substrate 12 in the range of about 2 to 30 cm (preferably about 5 or 6 cm) produces the best results. When using the diluted silane or "safe gas" according to this invention, a pressure in the range of about 50 to 500 millitorr is preferred. The preferred pressure and spacing produce about 20 to 40 atomic collisions between silicon and hydrogen species as the atoms migrate from the filament 16 to the substrate 12, based on the statistical relationship of mean free path of an atomic particle being about eight divided by the pressure in millitorr, which, as mentioned above, appears to produce the best results for device quality film. Collisions of silicon and hydrogen species with helium species do not appear to affect the results, possibly because of the relatively low atomic weight of helium in relation to silicon, which accounts for the higher pressure needed when using the helium-siluted safe silane gas according to this invention.

Figure 2:
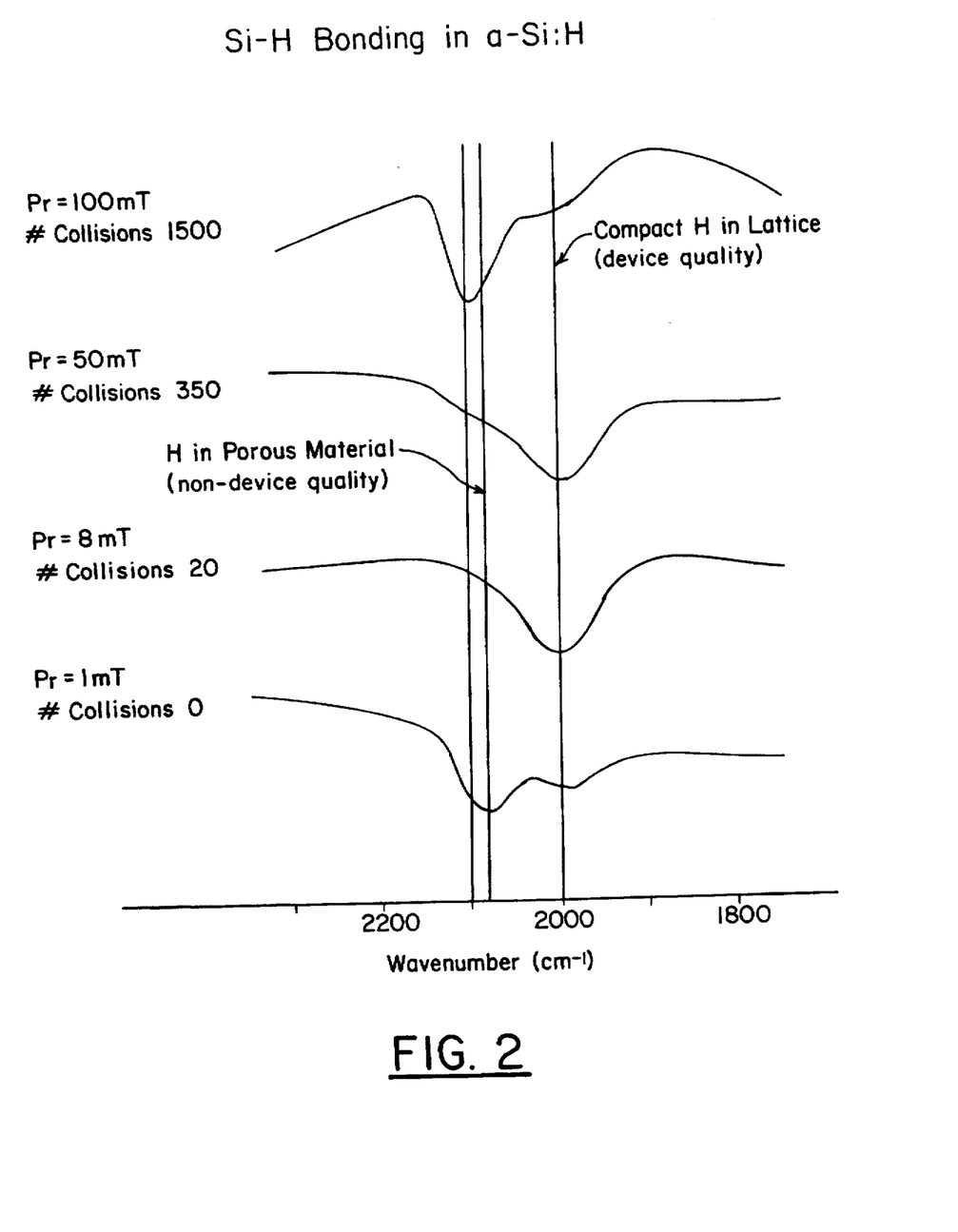
FIG. 2 is a graph that shows the type of Si-H bonding versus the approximate number of collisions the atomic species evaporated from the 2000° C. filament undergo as they traverse the filament to substrate distance in the deposition chamber and illustrates the parameters that produce device quality a-Si:H according to this invention.

The graphs in FIG. 2 show the types of Si-H bonding versus the approximate number of collisions that the atomic species evaporated from the 2000° C. filament undergo as they traverse the filament-substrate distance in the deposition chamber. The graphs are offset vertically to show differences in curve shapes. It is known in the hydrogenated amorphous silicon field that a dip in the transmission curve in the neighborhood of 2000 wave numbers is the signature of H bonded in the monohydride, or SiH mode. This characteristic is indicative of H bonded in a compact Si lattice, and it is observed traditionally in device quality a-Si:H. It is also known that a dip in the transmission curve in the neighborhood of 2070–2100 wave numbers can be the signature of H bonded polyhydride, or $(SiH_2)_n$ mode, which is indicative of H bonded in a porous lattice and is observed traditionally in non-device quality a-Si:H. As can be seen in FIG. 2, when the number of collisions is either too few or too many, the polyhydride signature is clearly evident. It is only when the number of collisions are limited, as discussed in this invention, that device quality a-Si:H is produced.

While it is not entirely clear at this point exactly why these pressure and distance parameters produce the best device quality hydrogenated amorphous silicon films, it is believed that the pure atomic species which are evaporated off the filament collide either with themselves or with the dissociated or undissociated silicohydride gas and produce a different mixture of radical species than is produced in the $SiH_3$ dominated glow discharge process. It is these radical species, which in turn hit the substrate, that become integrated into the growing film. Fewer atomic collisions, it is believed, would increase the likelihood of pure atomic silicon hitting the substrate, and more atomic collisions would produce higher order silicon-hydride clusters (microparticulates) to form in the gas phase and also hit the substrate. Both of these extremes would produce a-Si:H of inferior electronic and structural quality.

Experiments have shown that about 8 millitorr pressure when using concentrated silane gas seems to produce the best device quality hydrogenated amorphous silicon films, and such films produced at 1 millitorr and those produced at 100 millitorr and higher were not as good. However, as discussed above, about 80 millitorr pressure seems to produce the best results when the helium-diluted safe gas is used according to this invention.

The fourth parameter, the substrate temperature, also seems to be a controlling factor in the quantity of hydrogen finally incorporated into the hydrogenated amorphous silicon film. The relationship between substrate temperature and hydrogen content appears to be that the higher the substrate temperature, the lower the hydrogen content of the hydrogenated amorphous silicon film. In fact, experiments that lead to the development of this invention indicate that the hydrogen content, measured in atomic percent hydrogen, in the hydrogenated amorphous silicon film decreases monotonically as the temperature of the substrate 12 increases. Consequently, it has been found that, as used in this invention with the other parameters described above, the temperature of the substrate 12 should be maintained in the range of 200° to 600° C., and preferably at about 400° C., during the deposition process. Heating the substrate table or holder 18 to the temperature of about 400° to 600° C. actually results in slightly lower temperatures in the range of about 300° to 450° C. at the substrate surface due to the high vacuum, infrared radiation from the substrate surface, and other thermal conduction inhibitions. At this preferred substrate temperature range, a significant proportion of the hydrogen atoms that hit the substrate 12 retain sufficient thermal mobility to diffuse back out of the forming hydrogenated amorphous silicon film and are released as molecular hydrogen from the growing film.

One additional factor has been identified, which might contribute to allowing a superior a-Si:H film to be produced with such low H content according to this invention. As opposed to the glow discharge process, where particles in the discharge are energetic electrons, neutral radical species and ions, the maximum energies obtainable in the process of the present invention are the thermal energies that the atomic species receive as they are evaporated off the substrate. In addition, since these species undergo a few collisions in the gas phase, the energies of the mix of radical species in the deposition chamber is reduced even further. Therefore, at these low thermal energies, no ions or energetic electrons are produced in the gas phase. Since it is generally believed that film bombardment by energetic species damages the growing film surface, films grown by the present technique may avoid the effects of such bombardment.

It has generally been believed, prior to this invention, that the "normal" hydrogen content in amorphous silicon films not only passivate the film by filling bonds, but also was necessary to reduce lattice strain in the amorphous silicon. The method of this invention, however, may allow the deposition of lower hydrogen contact hydrogenated amorphous silicon with reduced randomness of the deposited silicon, thus with reduced lattice strain between the silicon atoms within the film. This reduced silicon lattice strain, coupled with the higher substrate temperature, may also allow much of the hydrogen which strikes substrate 12 to have sufficient thermal mobility to escape being incorporated into the hydrogenated amorphous silicon film.

A lowered hydrogen content in the hydrogenated amorphous silicon film is desired because of the observed link between hydrogen content and the subsequent degradation of photovoltaic cells upon exposure to sunlight. This degrading effect is called the Staebler-Wronksi effect and is strongly linked to the hydrogen content of the amorphous silicon film. It is believed that the degradation occurs as a result of movement of the hydrogen. Accordingly, if the hydrogen content can be lowered while still retaining good device quality amorphous silicon film, as can be accomplished with the present invention, the tendency or extent of the degradation of electrical properties due to the Staebler-Wronski effect can also be reduced. As mentioned above, hydrogenated amorphous silicon films produced according to this invention from concentrated silane can have as little as one atomic percent (1 at. %) hydrogen, yet have better electrical properties, including better transport of charge carriers with band gaps comparable to prior art films that need as much as 10 to 15 at. % hydrogen to have acceptable electrical properties for device quality film. While such improved electrical properties have not yet been achieved for low hydrogen content hydrogenated amorphous silicon films from the helium-diluted safe gas, such results are believed to be attainable.

EXAMPLE I

Presented below is a comparison between a deposition of a low hydrogen content, amorphous silicon film produced according to the principles of the present invention and one produced by the more traditional glow discharge (GD) deposition process. The use of hot wire or filament to assist a vapor deposition, as in the current invention, is commonly referred to as a hot-wire-assisted chemical vapor deposition or hot wire (HW) deposition. It is to be understood that the examples given below are for illustrative purposes only, and are not intended to limit the scope of the invention as herein described or as set forth in the appended claims.

Some hot wire (HW) films were deposited using the method of the present invention, as described above, using silane gas, a deposition chamber pressure of 8 millitorr, and a filament temperature of about 2,000° C. The substrate temperature, however, was varied to change the atomic-percent of hydrogen contained within the various films. Each sample at a particular substrate temperature, and therefore particular atomic percent hydrogen content, was simultaneously deposited onto 7059 glass and crystalline silicon substrate. The deposition rates for these HW films, deposited according to the principles of the present invention, were 5–10 Å/sec.

The glow discharge (GD) films were deposited on the anode of a capacitively coupled, parallel plate, radio frequency deposition apparatus, which was operating at 13.56 MHz. The other operating conditions were selected to produce a high quality, or device quality, hydrogenated amorphous silicon film. These conditions include a 70 mW/cm$^2$ discharge power, silane at a flow rate of 100 sccm, and a 500 millitorr chamber pressure. Similar to the HW films, several GD films were deposited over a range of substrate temperatures, and thus, hydrogen contents, simultaneously onto 7059 glass and crystalline silicon. The deposition rates for the GD films deposited were in the range of 1.5–2.5 Å/sec.

The hydrogen content of each of these samples were determined from the films deposited onto the crystalline silicon substrate by the magnitude of the absorption of the SiH 630 cm$^{-1}$ infrared mode. Film thickness for all samples were typically 1.5–2.5 μm, and Raman measurements showed all films to be amorphous.

Several measurements were taken on these HW and GD films in order to compare their electrical, chemical, and mechanical properties. These measurements included Urbach tail widths ($E_o$), Tauc's bandgaps ($E_g$), photoconductivity, dark conductivity, Electron Spin Resonance (ESR), and ambipolar diffusion lengths.

Figure 3:
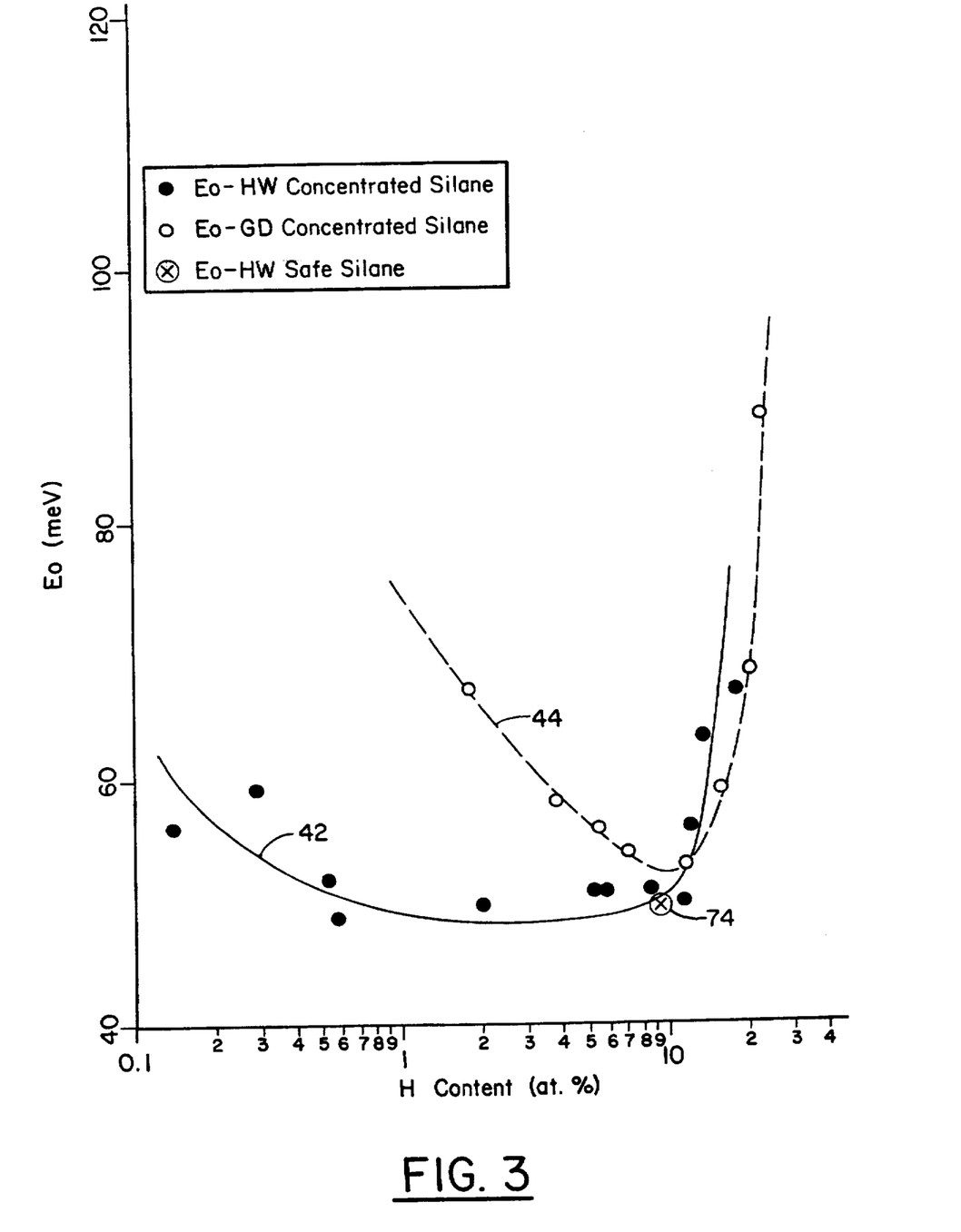
FIG. 3 is a graph of Urbach Tail widths versus hydrogen content of a series of hydrogenated amorphous silicon films produced according to the principles of the present invention and a series of traditional glow discharge deposited hydrogenated amorphous silicon films for comparison, as well as a data point representing results to date with the helium-diluted safe silane gas according to this invention.

The Urbach tail widths ($E_o$), for the various hydrogen concentrations of the GD films and the HW films deposited according to the principles of the present invention, were determined by photothermal deflection spectroscopy. These measurements of Urbach tail widths in millielectron volts (meV) are plotted in FIG. 3 against a logarithmic scale of hydrogen concentrations or "H content" in atomic percent, to show a wide range of data and to better emphasize the differences between the GD and HW samples at low H content. The discrete data for the HW samples deposited according to the principles of the present invention are represented by the solid dots. The trends of this data are approximated by continuous line 42. Similarly, the discrete data for the GD samples are represented by the hollow dots and approximated by the continuous line 44. There are two regions of interest in the comparison of these two sets of samples. First, for that region above 10 at. % hydrogen, both the HW and GD samples display similar characteristics, in that the Urbach tail widths increase rapidly in this region. For that region below 10 at. % hydrogen, the GD films again show increasing Urbach tail widths. However, the HW films, deposited according to the principles of the present invention, remain approximately at a 50 meV minimum until well below a hydrogen concentration of 1 at. %. This 50 meV value of Urbach tail width is respectable and is typical of device quality films. Therefore, this graphic representation in FIG. 3 illustrates that the HW film with substantially lower H content (1 at. %) according to this invention is of comparable device quality to the more conventional GD films having more moderate content (10 at. %). Yet, as described above, the HW film according to this invention is less susceptible to Staebler-Wronsik effect degradation because of its much lower H content.

It is important to note that it was impossible, in making the two sets of films, to lower the H content of the GD films below the values of 2–3 at. %, and thus enable a comparison with the low H constant HW films, without the GD films becoming microcrystalline.

Figure 4:
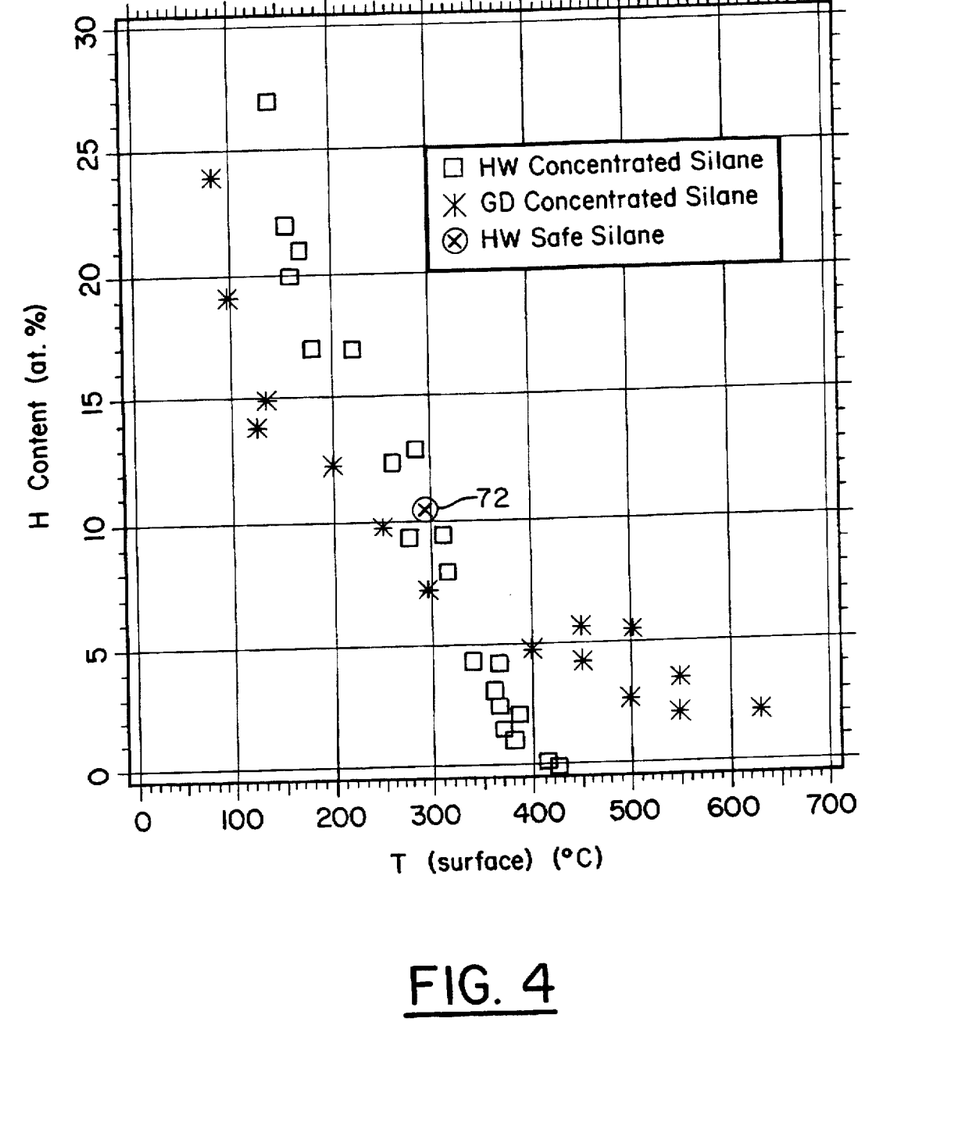
FIG. 4 is a graph of the H contents of the respective hot wire and glow discharge films plotted as a function of the surface temperature of the growing film, indicating possible differences in how the H is bonded in the two series of films, as well as a data point representing results to date with the helium-diluted safe silane gas according to this invention.

FIG. 4 shows a graph of the H contents of the respective films as a function of the surface temperature of the growing film. For hydrogen contents less than about 10 at. %, the predominant mode of binding was in the SiH, or monohydride, mode (see FIG. 2) for both sets of films. However, for temperatures in excess of 400° C., almost all the H is removed from the HW films, while a significant amount of H still remains incorporated in the GD films. These data suggest basic differences in how the H in the monohydride mode is bonded in the two sets of films as the substrate temperature is increased, which may explain in part the differences in the structural, electronic, and light soaking properties observed between the low H content HW and GD films.

Figure 5:
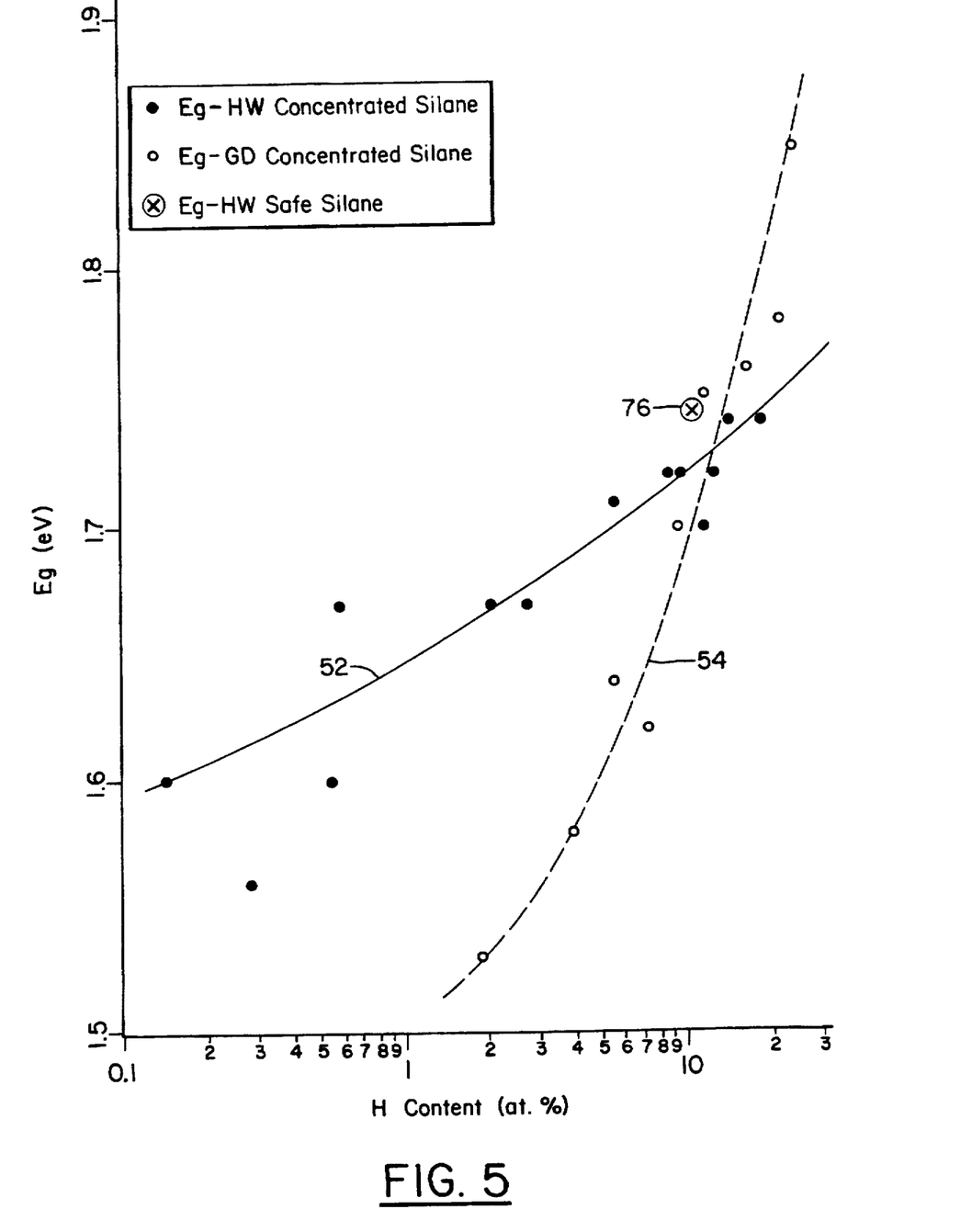
FIG. 5 is a graph of Tauc's Bandgap versus hydrogen content of the same series of hydrogenated amorphous silicon films produced according to the principles of the present invention and the same series of traditional glow discharged deposited hydrogenated amorphous silicon films for comparison, as well as a data point representing results to date with the helium-diluted safe silane gas according to this invention.

The measured values of the Tauc's bandgaps ($E_g$), in electron volts, for the two sets of samples are plotted in FIG. 5 once again against a logarithmic scale of hydrogen content in atomic percent. As with the prior graph in FIG. 2, the solid dots represent the discrete HW data and the hollow dots represent the discrete GD data. This HW data is approximated by continuous line 52 and the PECVD data is approximated by continuous line 54. Both show the traditional linear dependence of bandgap ($E_g$) and at. % hydrogen. However, the HW films produced in accordance with the principles of the present invention, show a more flattened linear relationship, which is indicative of a film with greater integrity and less dependence on the number of hydrogen bonds.

Figure 6:
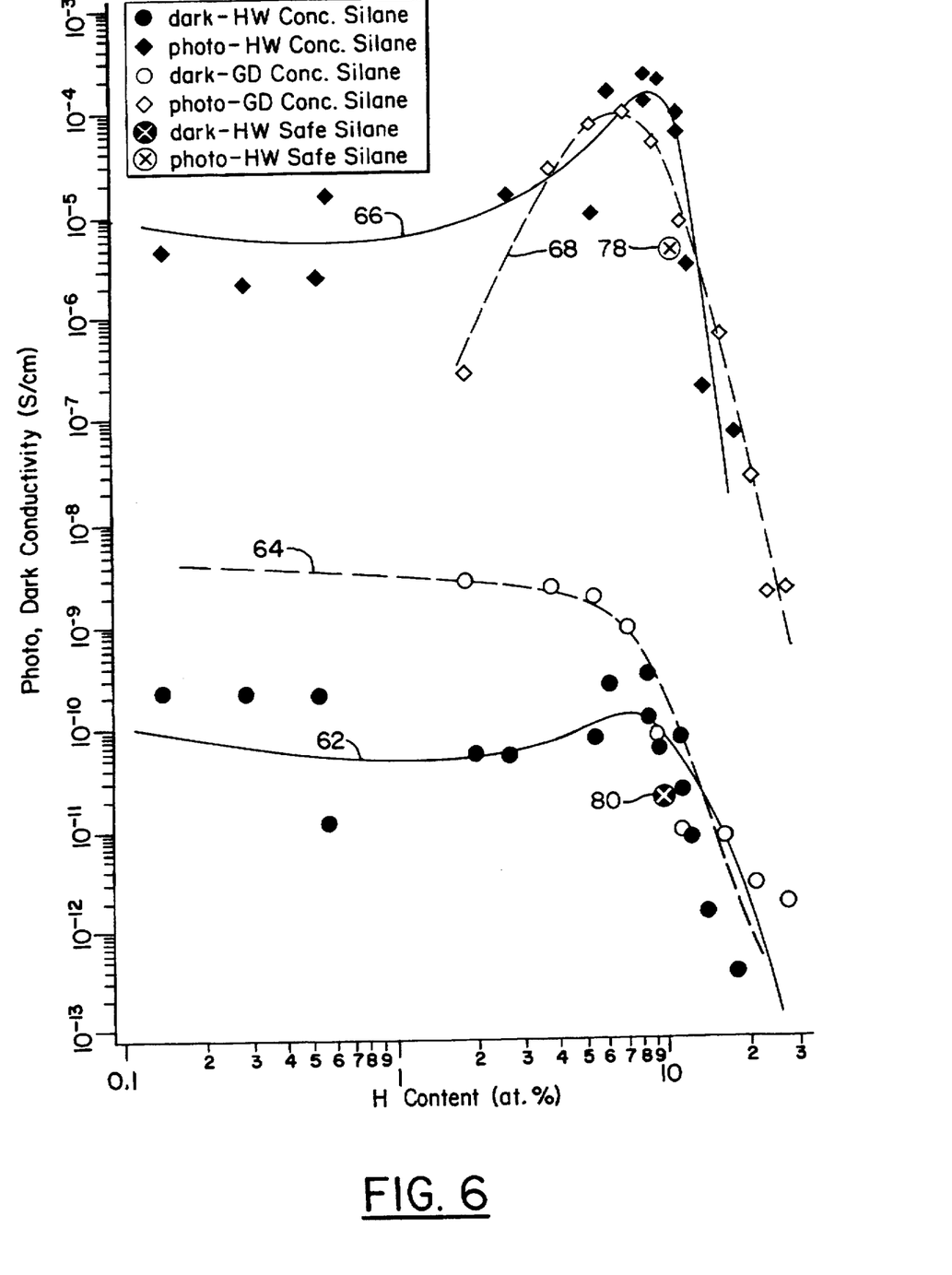
FIG. 6 is a graph of Photo and Dark Conductivity versus hydrogen content of the hydrogenated amorphous silicon films produced according to the principles of the present invention and the traditional glow discharge deposited hydrogenated amorphous silicon films for comparison, as well as a data point representing results to date with the helium-diluted safe silane gas according to this invention.

The Photo and Dark Conductivity, expressed in S/cm, for both the HW and GD sets are plotted on the same graph, in FIG. 6, against a logarithmic scale of hydrogen content in at. %. Once again the HW data for the films produced in accordance with the present invention are the solid discrete points, which, in this case are circular dots for the Dark Conductivity and diamond shapes for the Photoconductivity. Similarly, the hollow circular dots represent the Dark Conductivity for the GD films samples, and the hollow diamonds represent the Photoconductivity for the GD films. Line 62 approximates the Dark Conductivity for the HW films, and line 64 approximates the Dark Conductivity for the GD films. Line 66 represents an approximation of the Photoconductivity of the HW film samples, and line 68 the Photo-conductivity of the GD film samples.

In that region above a hydrogen content of 10 at. % hydrogen, both sets of data in FIG. 6 show similar characteristic rapidly decreasing conductivity for both Photo and Dark Conductivity for increasing at. % H. However, for that region below a hydrogen concentration of 10 at. % hydrogen, including 1 at. % hydrogen and below, the films of the HW samples deposited according to the principles of the present invention show much higher levels of Photoconductivity and lower levels of Dark Conductivity, both of which are marked improvements over the GD films. Note that the only way of reaching H contents less than 1 at. % for the GD films is to take a film previously deposited at a lower substrate temperature (e.g., 290° C.) and anneal it in vacuum to drive out the bonded H. When this is done, enabling H contents in the range 1.0–0.5 at. % to be produced, the ratio of photo or light to dark conductivity for the GD films is on the order of 2–3, while the photo or light to dark conductivity ratio for as grown HW films of comparable H contents is on the order of $10^4$. This result again illustrates the superior electronic nature of the low H constant HW films.

Preliminary Electron Spin Resonance (ESR) measurements were taken on a 7 µm thick sample of the HW film at a hydrogen content of 10 at. %, and on a 1.5 µm thick sample of a 0.6 at. % hydrogen content sample of a HW film, both deposited with concentrated silane in accordance with the principles of the present invention. The former film contained $3\times10^{15}/cm^3$ spins, which is typical of device quality hydrogenated amorphous silicon films deposited by the GD Technique, while the latter HW film had a spin density of $1.3\times10^{16}/cm^3$ spins, which is considerably lower than has been previously observed for a GD film in this range of hydrogen content.

The final comparison of the quality for these two samples, the ambipolar diffusion lengths, were measured by the steady state photograting technique. The HW films produced with concentrated silane according to the principles of the present invention gave values for the ambipolar diffusion lengths as high as 2000 Å for the films with low hydrogen concentrations, which are greater than those values observed for device quality GD hydrogenated amorphous silicon films (about 1500 Å) containing larger (10 at. %) hydrogen contents.

In summary, the data shows that for a hydrogenated amorphous silicon film deposited with concentrated silane according to the principles of the present invention, with a hydrogen content as low as 1 at. %, the photoconductivity is between 1 and $2\times10^{-5}/cm$, the light to dark conductivity ratio is greater than $10^5$, the Urbach tail width is 50 meV, the bandgap is 1.67 eV, and the ambipolar diffusion length is as high as 2000 Å. All of these data are indicative of device quality electronic performance.

Figure 7:
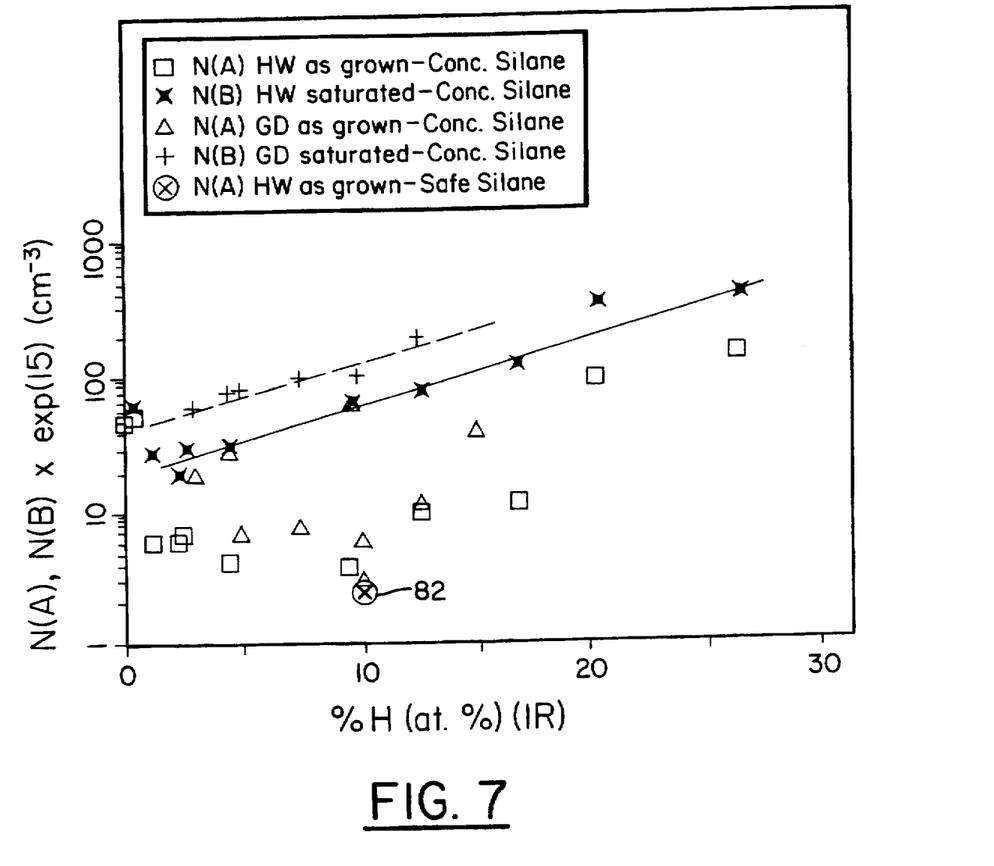
FIG. 7 is a graph comparing midgap defect density values for hot wire and glow discharge samples as grown and light soaked versus hydrogen concentration, as well as a data point representing results to date with the helium-diluted safe silane gas according to this invention, although a sample prepared with helium-diluted safe gas has not been light-soaked to date.

Finally, in FIG. 7, we show values of the midgap defect density for selected HW and GD films, plotted versus a linear scale of hydrogen concentration in at. %, in the samples (N(A)) as grown, and also for samples (N(B)) when they are light soaked to saturation in a way such that no further increase in midgap state density is observed to occur upon additional light soaking. A linear scale of H concentration was chosen here, because no light soaking comparisons were made for samples containing H contents <1 at. %. The important point illustrated in FIG. 7 is that the saturated defect densities for the HW films are consistently lower than those for the GD samples containing comparable H contents, and the saturated values for the HW samples containing low H contents (1–4 at. %) are lower than the values for state of the art GD samples deposited at substrate temperatures of 290° C. and containing approximately 10 at. %H. This data supports the observation that degradation of photoelectric cells upon exposure to sunlight can be reduced when the low H content a-Si:H material, which is the subject of the present invention, is incorporated into such a cell.

Accordingly, a process has been provided which demonstrates fast rate, large area deposition of device quality, low hydrogen content, hydrogenated amorphous silicon films, particularly when using concentrated silane. The low hydrogen content, hydrogenated amorphous silicon films exhibit greater material integrity and stability because of the lowered hydrogen content, while still demonstrating improved electrical, chemical, and structural properties, is not as subject to Staebler-Wronski effect degradation as the conventional device quality films, which prior to the invention, had to be produced with substantially higher hydrogen content to achieve device quality electronic characteristics.

While the technique described above is very efficient and effective in producing device quality hydrogenated amorphous silicon films, there can be significant safety problems associated with the use of silane gas in the process. Unfortunately, concentrated silane gas is not only toxic, but it is also very explosive. Safety controls and procedures for handling silane gas are available, but they are very expensive and require rigid monitoring and controls. Such mandatory safety controls include the use of a toxic gas monitor, a liquid scrubber that decomposes the exhaust gases, a well ventilated system enclosure, nitrogen dilution of the exhaust gases before and after the exhaust pumps, multiple in-series regulators with both manual and pneumatic shut-off valves on the gas inlet lines, and a chamber overpressure monitor. There must be system interlocks to immediately shut off the gas flow in the event of a failure of any one of the safety controls.

The alternative embodiment of this invention that also achieves device quality hydrogenated amorphous silicon, but with safer materials, includes the use of highly diluted source gas comprising less than one percent (1%) silane or other silicohydride gas in helium or some other inert gas. This alternative embodiment process can still utilize the hot wire technique described above in which the silane or other silicohydride gas is decomposed into atomic silicon and atomic hydrogen with a wire filament heated above 1,500° C. (preferably about 2,000° C.) in a vacuum in the range of about 60 to 300 millitorr and deposited on a substrate at a surface temperature in the range of about 200° to 600° C.

A concentration of less than one percent (1%) silane in a inert gas, such as helium, is considered to be "safe" gas that is not toxic, explosive, or flammable. Below a concentration of 0.77%, it is classified by the United States Department of Transportation as merely a compressed gas and requires only ordinary safety precautions for handling and storing compressed gases.

Because of the very diluted silane gas concentration, the flow rate is increased by as much as a factor of twenty over the highly concentrated silane gas flow rates and volumes described above. However, both deposition rate and device quality of the resulting hydrogenated amorphous silicon film remain comparable to those of the high concentration silane process described above. While any silane concentration in an inert gas, such as helium, of less than one percent (1%) is considered to be a "safe" gas, use of silane concentrations of less than about one-fifth of a percent (0.20%) in this process would not be feasible because the deposition rates would drop to unacceptably low levels. Therefore, the preferred concentration of silane in inert gas for purposes of this alternate embodiment of this invention is in the range between one percent (1%) at the high end and about one-fifth of a percent (0.20%) at the low end. A concentration of about one percent (1.0%) silane in helium has provided good results, as shown in the example described below. The presence of helium can also have some other subtle effects that might require some adjustments in process parameters. For example, it is believed that the radicals, which come off the hot filament and collide with lighter helium gas molecules, might diffuse different distances than when they collide with residual silane gas molecules. This difference can affect cooling and energy dissipation, thus requiring slight adjustments in vacuum and substrate temperatures.

EXAMPLE II

For a gas flow rate of 300 sccm (0.95% silane in helium), a chamber pressure of 80 millitorr, a filament temperature of about 2,000° C., a substrate surface temperature of 290° C., a filament to substrate spacing of 5.5 cm, and deposition rates on the order of 1 to 1.5 Å/sec., a hydrogenated amorphous silicon film was obtained with a hydrogen content of about 10 at. %, as indicated by data point 72 in FIG. 4. The Urbach tail width 74, Tauc's bandgap 76, photo-conductivity 78, dark conductivity 80, and electron spin resonance (ESR) 82 data points for that a—Si:H film are shown in FIGS. 3 and 5–7 to be comparable to state-of-the-art a—Si:H films with 10 at. % hydrogen content from concentrated silane by either glow discharge (GD) or hot wire (HW) method. The ambipolar diffusion length of that film was found to be 1,700 to 1,800 Å, and the density of defect states was about $3 \times 10^5$ defects/cm$^3$.

EXAMPLE III

An a-Si:H film was deposited from safe (diluted) silane gas substantially the same as in Example II, except the substrate spacing to the filament was set closer at only about 1 cm, and a higher pressure of about 300 millitorr was used. The hydrogen content of the a-Si:H film again was about 10 at. %, and the electronic properties of Urbach tail width, Tauc's bandgap, photo-conductivity, and ESR were about the same as those in Example II. However, at this closer spacing (1 cm) and higher pressure (300 millitorr), deposition rates as high as 3 Å/sec. were obtained.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to falling within the scope of the invention as defined by the claims which follow.

The embodiments of the invention in which an exclusive property or privilege is claimed are defined as follows:

1. A method or producing hydrogenated amorphous silicon on a substrate, comprising the steps of:

positioning the substrate in a deposition chamber at a distance of about 1 to 7 cm from a heatable filament in the deposition chamber;

maintaining a pressure in said deposition chamber in the range of about 60 to 300 millitorr, heating the filament to a temperature in the range of about 1,800° to 2,100° C., and heating the substrate to a surface temperature in the range of about 200° to 400° C.; and flowing a stream of gas mixture from a source comprising less than one percent (1%) silicohydride gas and more than ninety-nine percent (99%) inert gas into contact with said heated filament to decompose said silicohydride gas into silicon and hydrogen atomic species and allowing said silicon and hydrogen atomic species to migrate to and deposit on said substrate while adjusting and maintaining said pressure in said deposition chamber at a value in relation to the distance between said filament and said substrate that produces statistically about 5 to 100 atomic collisions among the silicon and hydrogen species migrating to said substrate and undecomposed molecules of the silicohydride gas or inert gas in the deposition chamber.

2. The method of claim 1, wherein said inert gas comprises helium.

3. The method of claim 2, wherein said steps of positioning the substrate in the deposition chamber and maintaining the pressure in the deposition chamber to produce statistically about 5 to 100 atomic collisions among the silicon and hydrogen atomic species and the undecomposed molecules comprises positioning the substrate about 1 to 7 cm from the filament and maintaining the pressure at about 80 millitorr.

4. The method of claim 2, including the step of maintaining the surface temperature of the substrate at about 290° C. during deposition to produce said hydrogenated amorphous silicon on said substrate with less than 10 atomic percent hydrogen.

5. The method of claim 2, including the step of maintaining the temperature of the filament at about 2,000° C. during deposition.

6. A method of producing hydrogenated amorphous silicon on a substrate, comprising the steps of:

positioning the substrate in a deposition chamber at a distance of about 5.5 cm from a heatable filament in the deposition chamber;

maintaining a pressure in said deposition chamber in the range of about 80 millitorr, heating the filament to a temperature in the range of about 2,000° C., and heating the substrate to a surface temperature in the range of about 290° C.; and flowing a stream of gas mixture from a source comprising about 0.95 percent (0.95%) silane gas and about 99.05 percent (99.05%) helium gas into contact with said heated filament to decompose said silicohydride gas into silicon and hydrogen atomic species and allowing said silicon and hydrogen atomic species to migrate to and deposit on said substrate.

7. A method of producing hydrogenated amorphous silicon on a substrate, comprising the steps of:

positioning the substrate in a deposition chamber at a distance of about 1 cm from a heatable filament in the deposition chamber;

maintaining a pressure in said deposition chamber in the range of about 300 millitorr, heating the filament to a temperature in the range of about 2,000° C., and heating the substrate to a surface temperature in the range of about 290° C.; and flowing a stream of gas mixture from a source comprising about 0.95 percent (0.95%) silane gas and about 99.05 percent (99.05%) helium gas into contact with said heated filament to decompose said silicohydride into silicon and hydrogen atomic species and allowing said silicon and hydrogen atomic species to migrate to and deposit on said substrate.

* * * * *